(12) United States Patent
Iwai

(10) Patent No.: US 8,116,425 B2
(45) Date of Patent: Feb. 14, 2012

(54) SHIFT REGISTER

(75) Inventor: Hitoshi Iwai, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/184,941

(22) Filed: Jul. 18, 2011

(65) Prior Publication Data

US 2011/0274235 A1    Nov. 10, 2011

Related U.S. Application Data

(62) Division of application No. 12/507,351, filed on Jul. 22, 2009, now Pat. No. 8,000,432.

(30) Foreign Application Priority Data

Aug. 8, 2008   (JP) .................. 2008-206021

(51) Int. Cl.
    *G11C 19/00*   (2006.01)
(52) U.S. Cl. .............. 377/76; 377/77; 377/78; 327/202; 327/203
(58) Field of Classification Search .................. None
    See application file for complete search history.

(56) References Cited

U.S. PATENT DOCUMENTS

| 5,099,502 A | 3/1992 | Tazuke |
| 5,132,993 A | 7/1992 | Nishiura et al. |
| 6,891,917 B2 | 5/2005 | Chan et al. |
| 2009/0066385 A1* | 3/2009 | Hoover .......................... 327/202 |
| 2009/0189664 A1* | 7/2009 | Remington ................... 327/202 |
| 2009/0256596 A1 | 10/2009 | Oh |
| 2009/0256608 A1 | 10/2009 | Djaja et al. |

FOREIGN PATENT DOCUMENTS

| JP | 3-192600 | 8/1991 |
| JP | 3-256298 | 11/1991 |
| JP | 4-276394 | 10/1992 |
| JP | 5-250891 | 9/1993 |
| JP | 8-212794 | 8/1996 |

OTHER PUBLICATIONS

Office Action issued Jan. 1, 2011, in Japan Patent Application No. 2008-206021.

* cited by examiner

*Primary Examiner* — Tuan T Lam
(74) *Attorney, Agent, or Firm* — Oblon, Spivak, McClelland, Maier & Neustadt, L.L.P.

(57) ABSTRACT

A shift register includes a first flip-flop group composed of a plurality of cascaded first flip-flops, each first flip-flop having a first master latch and a first slave latch and having first and second transmission paths for transmitting a master clock and a slave clock, a second flip-flop group composed of a plurality of cascaded second flip-flops, each second flip-flop having a second master latch and a second slave latch which are each composed of a transistor with a relatively small transistor size and having a third transmission path connected to the first transmission path and a fourth transmission path connected to the second transmission path, and a transfer portion configured to transfer pieces of data held in the second flip-flops to one of the first master latches and the first slave latches of the first flip-flops.

3 Claims, 6 Drawing Sheets

SHIFT REGISTER

CROSS-REFERENCE TO RELATED APPLICATION

This application is a division of and claims the benefit of priority under 35 U.S.C. §120 from U.S. Ser. No. 12/507,351, filed Jul. 22, 2009, and claims the benefit of priority under 35 U.S.C. §119 from Japanese Patent Application No. 2008-206021, filed in Japan on Aug. 8, 2008, the entire contents of which are incorporated herein by reference.

BACKGROUND OF THE INVENTION

1. Field of the Invention

The present invention relates to a shift register formed by cascading a plurality of master-slave flip-flops.

2. Description of Related Art

A shift register can be formed by cascading a plurality of flip-flops. For example, a master-slave flip-flop formed by cascading master and slave latches can be adopted as each of the flip-flops. The master latch and slave latch have configurations identical to each other and take in pieces of data in accordance with a master clock and a slave clock, respectively, to hold the pieces of data. Each flip-flop outputs data to a flip-flop in a next stage in synchronism with these clocks and holds transmitted data.

Examples of such a shift register include one proposed in Japanese Patent Application Laid-Open Publication No. 03-192600. Note that a data latch portion in a flip-flop configured to hold transmitted data can be formed by combining a plurality of gate circuits.

Along with microfabrication of transistors constituting a semiconductor device, tolerance for a soft error, which refers to a phenomenon in which data is erased by cosmic rays, radial rays, and the like, has recently been an issue. In order to ensure sufficient tolerance for a soft error, a transistor with a sufficiently large transistor size (a channel length (hereinafter referred to as L)) and a channel width (hereinafter referred to as W)) needs to be used as a transistor constituting a data latch portion of each flip-flop.

For this reason, a transistor cannot be formed to have minimum dimensions, and a circuit area of a conventional shift register becomes large.

BRIEF SUMMARY OF THE INVENTION

A shift register according to one aspect of the present invention includes a plurality of first flip-flops, each having a master latch and a slave latch, each of which includes a transistor with a first transistor size, a plurality of second flip-flops, each having a master latch and a slave latch, each of which includes a transistor with a transistor size smaller than the first transistor size, and a transfer portion configured to serially transfer data through the plurality of cascaded first and second flip-flops and, when the serial transfer is ended, provide pieces of data held in the second flip-flops to one of the master latches and the slave latches of the first flip-flops to cause the one latch to store the pieces of data.

DETAILED DESCRIPTION OF THE INVENTION

Figure 1:
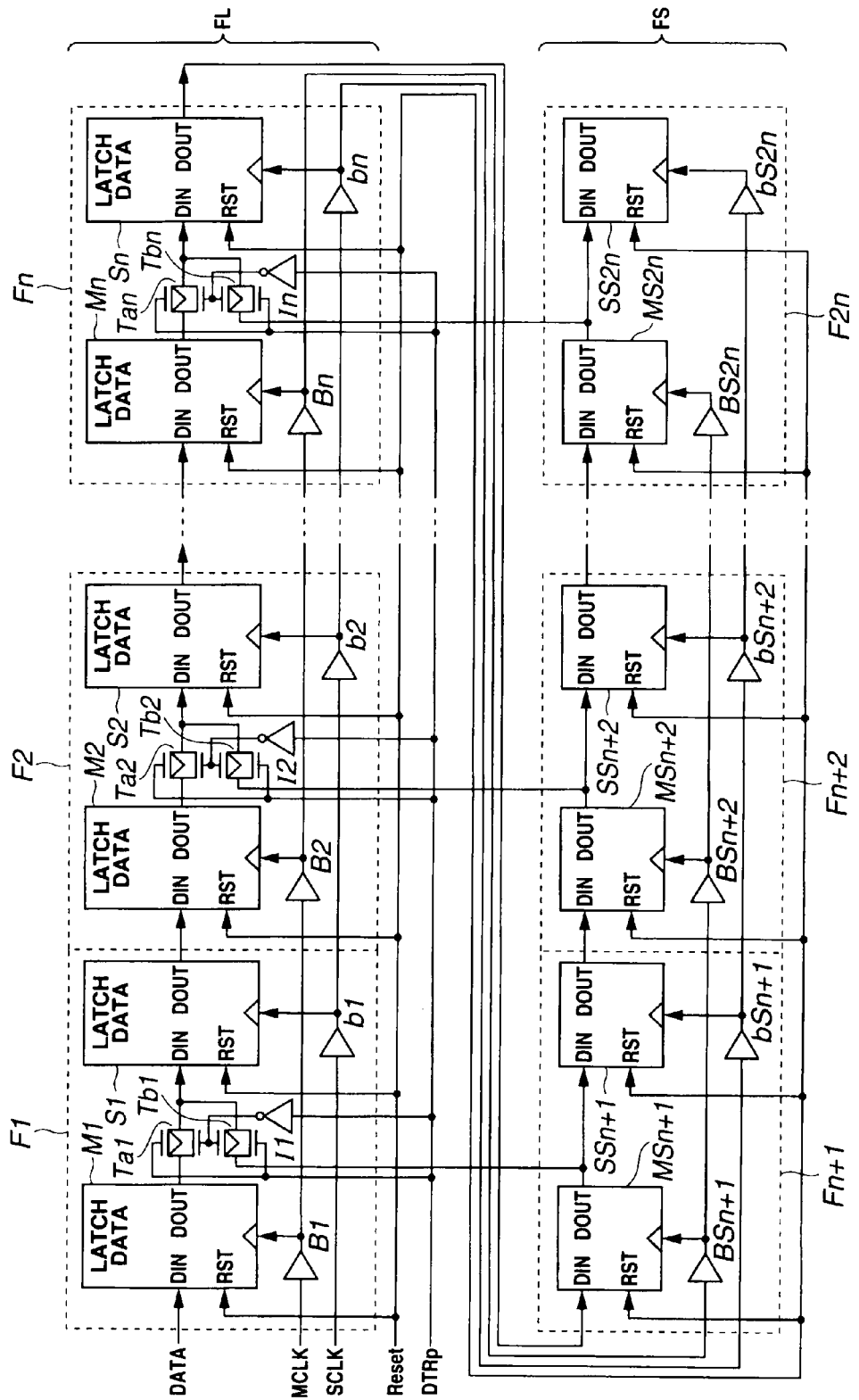
FIG. 1 is a circuit diagram showing a shift register according to a first embodiment of the present invention.

Embodiments of the present invention will be described in detail below with reference to the drawings. FIG. 1 is a circuit diagram showing a shift register according to a first embodiment of the present invention.

The present embodiment relates to a shift register formed by cascading master-slave flip-flops. A master-slave flip-flop is configured such that a master latch and a slave latch are cascaded and take in pieces of data in accordance with a master clock and a slave clock, respectively, to hold the pieces of data.

Figure 2:
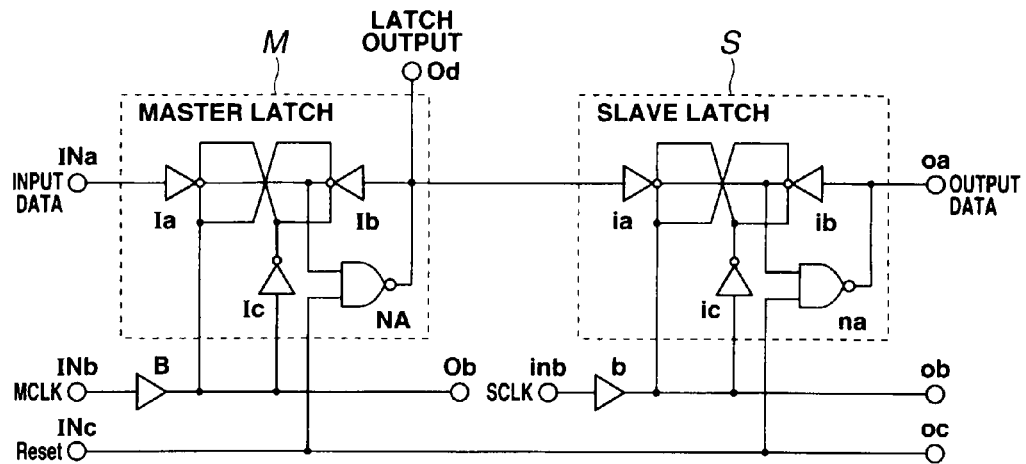
FIG. 2 is a circuit diagram showing an example of a specific configuration of a common master-slave flip-flop.

FIG. 2 is a circuit diagram showing an example of a specific configuration of a common master-slave flip-flop.

A master latch M is composed of clocked inverters Ia and Ib, an inverter Ic, and a NAND circuit NA. Data inputted to an input terminal INa is supplied to the clocked inverter Ia. A master clock MCLK is inputted to an input terminal INb. The master clock MCLK is provided to one control end of the clocked inverter Ia and the other control end of the clocked inverter Ib through a buffer B. After the master clock MCLK is inverted by the inverter Ic, the master clock MCLK is provided to the other control end of the clocked inverter Ia and one control end of the clocked inverter Ib.

The clocked inverter Ia is turned on, inverts inputted data, and supplies the inverted data to one input end of the NAND circuit NA when the master clock MCLK is at high level (hereinafter referred to as H level). The clocked inverter Ia is turned off and does not output inputted data when the master clock MCLK is at low level (hereinafter referred to as L level). The clocked inverter Ib is turned on, inverts an output from the NAND circuit NA, and supplies the inverted output to the one input end of the NAND circuit NA when the master clock MCLK is at L level. The clocked inverter Ib is turned off and does not output an output from the NAND circuit NA when the master clock MCLK is at H level. A reset signal Reset is provided from an input terminal Inc to the other input end of the NAND circuit NA.

During normal operation, the reset signal Reset is at H level. When the master clock MCLK changes to H level, data from the input terminal INa is inverted and is supplied to the NAND circuit NA. Accordingly, an output from the NAND circuit NA is at H level if input data is at H level and is at L level if input data is at L level. That is, the master clock at H level allows input data to be taken in.

When the master clock MCLK changes to L level, the output from the NAND circuit NA is inverted by the clocked inverter Ib and is provided to the one input of the NAND circuit NA. Accordingly, H level continues to be outputted if output data from the NAND circuit NA is at H level while L level continues to be outputted if output data from the NAND circuit NA is at L level. That is, the master clock MCLK at L level allows data to be held. The output from the NAND circuit NA is supplied as an output from the master latch M to a slave latch S.

The slave latch S has a configuration identical to a configuration of the master latch M and is composed of clocked inverters ia and ib, an inverter ic, and a NAND circuit na. A slave clock SCLK is provided to one control end of the clocked inverter ia and the other control end of the clocked inverter ib through a buffer b. After the slave clock SCLK is inverted by the inverter ic, the slave clock SCLK is provided to the other control end of the clocked inverter ia and one control end of the clocked inverter ib.

The slave latch S takes in input data from the master latch M when the slave clock SCLK supplied through an input terminal inb changes to H level. The slave latch S holds output data from the NAND circuit na when the slave clock SCLK changes to L level.

As described above, in the common master-slave flip-flop, the clocked inverter Ib and NAND circuit NA of the master latch M and the clocked inverter ib and NAND circuit na of the slave latch S constitute each data latch portion configured to store data. Data held in each flip-flop of the shift register is finally outputted through an output terminal Od.

Note that, in a shift register using the flip-flop in FIG. 2, an output terminal oa of the slave latch S is connected to the input terminal INa of the master latch M in a next stage, an output terminal Ob is connected to the input terminal INb of the master latch M in the next stage, an output terminal ob is connected to the input terminal inb of the slave latch S in the next stage, and an output terminal oc is connected to the input terminal INc in the next stage. Identical pieces of data are held in the data latch portions of the master latch M and slave latch S. Every time each of the master clock and slave clock at H level is inputted, pieces of data are transferred to flip-flops in next stages.

If soft error tolerance is taken into consideration, as described above, a gate length and a gate width of a transistor in each data latch portion need to be increased to a certain degree. This makes it difficult to reduce a circuit area. However, since data only needs to be finally stored in one of the master latch M and the slave latch S in a shift register formed using a master-slave flip-flop, a process of reducing a circuit area by relatively increasing a transistor size of one of the master latch M and the slave latch S in consideration of soft error tolerance and relatively reducing a transistor size of the other is available.

Figure 3:
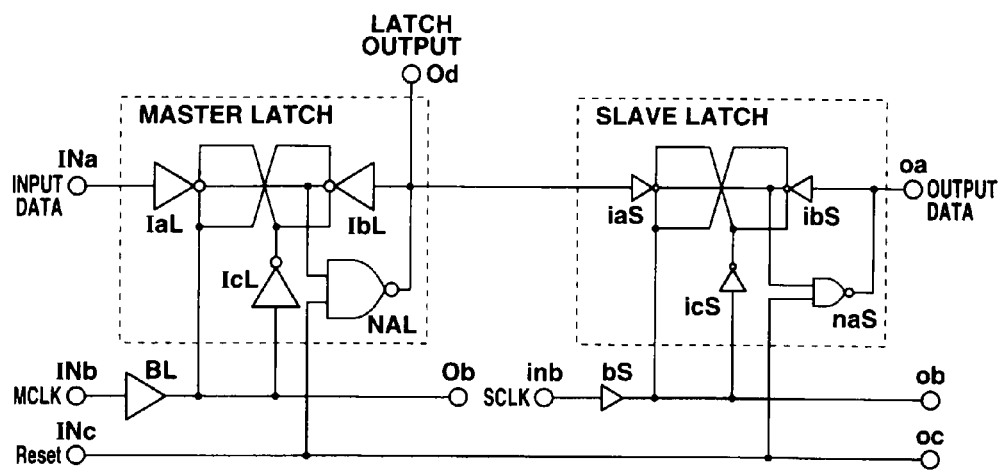
FIG. 3 is a circuit diagram showing a difference in transistor size.

FIG. 3 shows an example of such a case. In FIG. 3, a size of a symbol in a logic circuit is made to correspond to a transistor size. FIG. 3 shows that a transistor size increases with an increase in symbol size. More specifically, a master latch configured to output a latch output includes clocked inverters IaL and IbL, an inverter IcL, and a NAND circuit NAL, each of which is composed of a transistor with a relatively large transistor size. A slave latch includes clocked inverters iaS and ibS, an inverter icS, and a NAND circuit naS, each of which is composed of a transistor with a relatively small transistor size.

In the example in FIG. 3, an output from the NAND circuit NAL of the master latch is outputted as a latch output to the output terminal Od. A sufficient increase in each transistor size of the master latch allows an improvement in soft error tolerance, and a sufficient reduction in each transistor size of the slave latch allows a reduction in circuit area.

However, a transistor size of a buffer BL configured to transmit the master clock MCLK and a transistor size of a buffer bS configured to transmit the slave clock SCLK are different from each other in the configuration in FIG. 3. A transistor size of a buffer in a clock transmission path affects the amount of suppliable current, i.e., fan-out. Even if fan-out adjustment is carefully performed with layout of the master clock MCLK and slave clock SCLK in mind, the difference in transistor size between the buffers may make a slight difference in propagation velocity between the master clock MCLK and the slave clock SCLK. Particularly in a low-voltage-driven transistor, fan-out adjustment is extremely difficult, and a difference in propagation velocity is made between the master clock MCLK and the slave clock SCLK to cause racing.

A shift register sequentially transfers pieces of data through serially connected flip-flops. However, if the number of serial connections is large, a difference in propagation velocity between the master clock MCLK and the slave clock SCLK causes one of the clocks to be supplied ahead of the other, and data may not be correctly transferred.

Methods for coping with this include providing a transmission path for each clock independently of flip-flops, forming branch lines from the transmission paths (hereinafter referred to as main lines) to each flip-flop, and supplying the clocks to the master latch M and the slave latch S. In this case, it is possible to change transistor sizes of the master latch M and slave latch S without any reference to fan-out adjustment in each clock transmission path.

Although this method is resistant to racing between the master clock MCLK and the slave clock SCLK, racing is likely to occur between each clock and data. Methods for suppressing racing between a clock and data include inserting a delay element into a main line. However, this method requires space for a delay element and has the disadvantage of involving an increase in circuit area, e.g., when layout does not have enough space.

Under the circumstances, the present embodiment adopts two types of master-slave flip-flops with different transistor sizes. Buffers constituting transmission paths for the master clock MCLK and slave clock SCLK are provided in each flip-flop, and the transmission paths for the clocks can be formed to be symmetrical to each other in all, including transistor size. This makes it possible to reduce a circuit area while maintaining sufficient soft error tolerance.

A shift register according to the present embodiment includes a main flip-flop group FL formed by cascading flip-flops F1, F2, . . . , Fn, each of which is composed of transistors with relatively large transistor sizes and sufficient soft error tolerance, and a subordinate flip-flop group FS formed by cascading flip-flops Fn+1, Fn+2, . . . , F2n, each of which has relatively small transistor sizes and a reduced circuit area, as shown in FIG. 1.

The flip-flops F1 to Fn have configurations identical to each other and include master latches M1, M2, . . . (hereinafter representatively denoted by M) and slave latches S1, S2, . . . (hereinafter representatively denoted by S), each of which is composed of transistors with sufficiently large transistor sizes. The master latch M has a configuration identical to, e.g., the configuration of the master latch M in FIG. 2 and is composed of transistors with sufficiently large sizes. The slave latch S has a configuration identical to, e.g., the configuration of the slave latch S in FIG. 2 and is composed of transistors with sufficiently large sizes. For this reason, each of the flip-flops F1, F2, . . . , Fn of the main flip-flop group FL has sufficient soft error tolerance.

The flip-flops Fn+1 to F2n have configurations identical to each other and include master latches MSn+1, MSn+2, . . . (hereinafter representatively denoted by MS) and slave latches SSn+1, SSn+2, . . . (hereinafter representatively denoted by SS), each of which is composed of transistors with sufficiently small transistor sizes. The master latch MS has a configuration identical to, e.g., the configuration of the master latch M but is composed of transistors with sufficiently small sizes. The slave latch SS has a configuration identical to, e.g., the configuration of the slave latch S but is composed of transistors with sufficiently small sizes. For this reason, each of the flip-flops Fn+1, Fn+2, ..., F2n of the subordinate flip-flop group FS has a sufficiently small circuit area.

Figure 4:
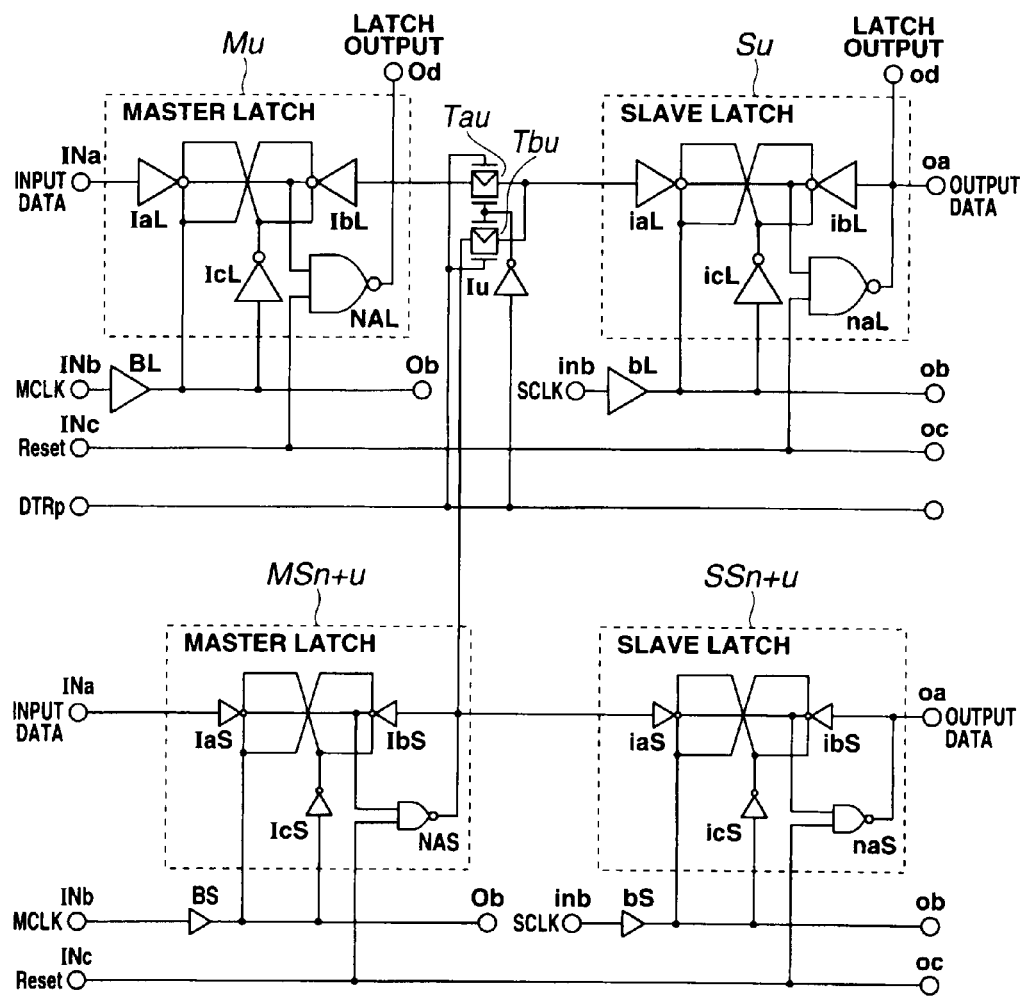
FIG. 4 is a circuit diagram showing an example of specific configurations of a flip-flop Fu which is a u-th flip-flop of a main flip-flop group FL and a flip-flop Fn+u which is a (n+u)-th flip-flop of a subordinate flip-flop group FS in FIG. 1.

FIG. 4 is a circuit diagram showing an example of a specific configuration of a flip-flop Fu which is a u-th flip-flop of the main flip-flop group FL and a flip-flop Fn+u which is a (n+u)-th flip-flop of the subordinate flip-flop group FS in FIG. 1. In FIG. 4, a size of a logic circuit symbol indicates a size of a transistor constituting a logic circuit which is indicated by the symbol.

In FIG. 4, a master latch Mu of the flip-flop in the main flip-flop group FL is composed of clocked inverters IaL and IbL, an inverter IcL, and a NAND circuit NAL, each of which has a relatively large transistor size. A slave latch Su is composed of clocked inverters iaL and ibL, an inverter icL, and a NAND circuit naL, each of which has a relatively large transistor size. On the other hand, a master latch MSn+u of the flip-flop in the subordinate flip-flop group FS is composed of clocked inverters IaS and IbS, an inverter IcS, and a NAND circuit NAS, each of which has a relatively small transistor size. A slave latch SSu is composed of clocked inverters iaS and ibS, an inverter icS, and a NAND circuit naS, each of which has a relatively small transistor size.

As shown in FIG. 1, the master clock MCLK is transmitted through serially connected buffers B1, B2, ..., BSn+1, ..., BS2n. Outputs from the buffers B1, B2, ..., BSn+1, ..., BS2n are supplied to the master latches M1, M2, ..., MSn+1, MSn+2, .... The slave clock SCLK is transmitted through serially connected buffers b1, b2, ..., bSn+1, ..., bS2n. Outputs from the buffers b1, b2, ..., bSn+1, ..., bS2n are supplied to the slave latches S1, S2, ..., SSn+1, ..., SS2n.

The buffers B1, B2, ..., Bn configured to supply the master clock MCLK to the main flip-flop group FL are formed to have relatively large transistor sizes, and the buffers BSn+1, BSn+2, ..., BS2n configured to supply the master clock MCLK to the subordinate flip-flop group FS are formed to have relatively small transistor sizes. Similarly, the buffers b1, b2, ..., bn configured to supply the slave clock SCLK to the main flip-flop group FL are formed to have relatively large transistor sizes, and the buffers bSn+1, bSn+2, ..., bS2n configured to supply the slave clock SCLK to the subordinate flip-flop group FS are formed to have relatively small transistor sizes.

That is, in the present embodiment, a transmission path for the master clock MCLK and a transmission path for the slave clock SCLK are formed to be symmetrical to each other in all, including transistor size. Accordingly, there is no racing between the master clock MCLK and the slave clock SCLK. Since the clocks are transmitted through the buffers provided in the flip-flops F1, F2, ... in the transmission path for the master clock MCLK and the transmission path for the slave clock SCLK, no racing occurs between each clock and data.

According to the present embodiment, transfer gates Ta1, Ta2, ..., Tan (hereinafter representatively denoted by Ta) are provided between DOUT terminals of the master latches M1, M2, ..., Mn and DIN terminals of the slave latches S1, S2, ..., Sn. Further, according to the present embodiment, transfer gates Tb1, Tb2, ..., Tbn (hereinafter representatively denoted by Tb) are provided between DOUT terminals of the master latches MS1, MS2, ..., MS2n of the subordinate flip-flop group FS and DIN terminals of the slave latches S1, S2, ..., Sn of the main flip-flop group FL.

A switch signal DTRp is supplied to one end of the transfer gate Ta and the other end of the transfer gate Tb. An inversion signal of the switch signal DTRp is supplied to the other ends of the transfer gates Ta1, Ta2, ... and one ends of the transfer gates Tb1, Tb2, ... through inverters I1, I2, .... This causes the transfer gate Ta to be turned on and the transfer gate Tb to be turned off during an L level period of the switch signal DTRp. The transfer gate Ta is turned off, and the transfer gate Tb is turned on, during an H level period of the switch signal DTRp.

Figure 5:
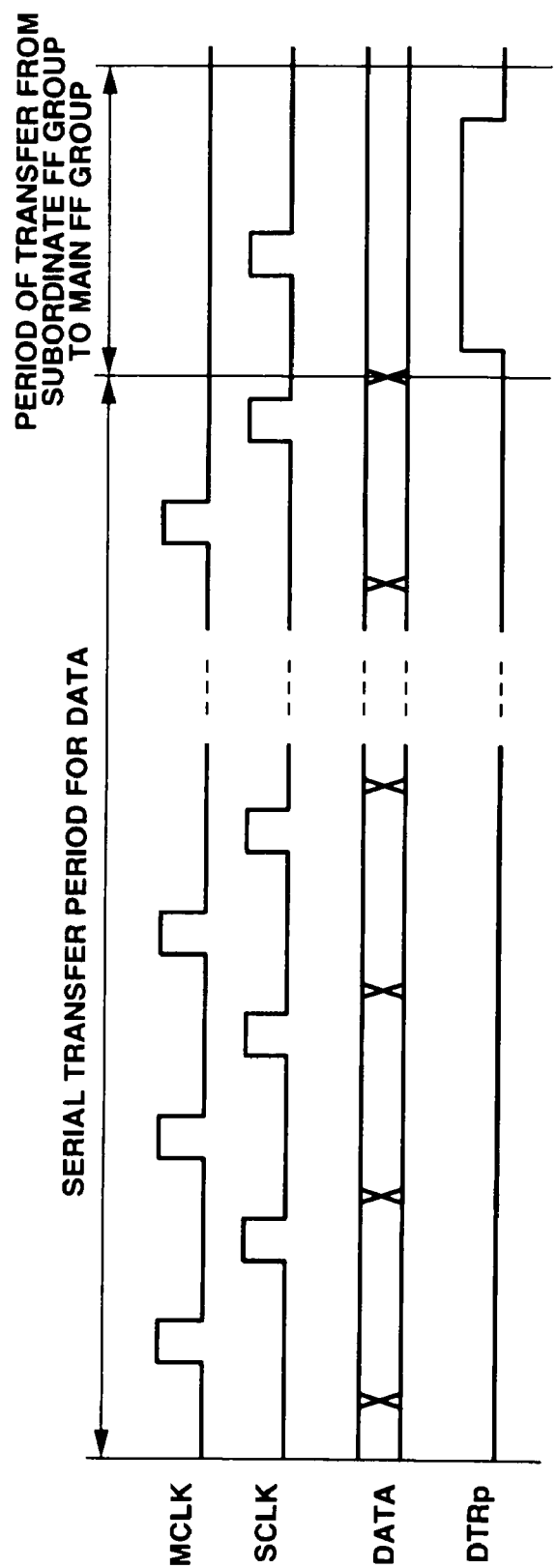
FIG. 5 is a timing chart for explaining operation in the first embodiment.

Operation of the embodiment with the above-described configuration will be described with reference to FIG. 5. FIG. 5 is a timing chart for explaining the operation in the first embodiment and shows the master clock MCLK, the slave clock SCLK, data, and the switch signal DTRp.

As shown in FIG. 5, the switch signal DTRp is at L level during a serial transfer period for data. Accordingly, the transfer gates Ta of the flip-flops F1, F2, ..., Fn are on, and the transfer gates Tb are off, during the serial transfer period. Pieces of data in the master latches M1, M2, ..., Mn are thus provided to the slave latches S1, S2, ..., Sn of the flip-flops F1, F2, ..., Fn.

More specifically, when the master clock MCLK changes to H level, the master latch M1 takes in a piece of input data while the master latches M2, M3, ..., Mn, MSn+1, ..., MS2n take in pieces of data in the slave latches S1, S2, ..., SSn+1, ..., SS2n−1 in previous stages. When the master clock MCLK changes to L level, the pieces of data taken in each of the master latches M of the main flip-flop group FL are each held by a data latch portion (see FIG. 4) composed of the clocked inverter IbL and the NAND circuit NAL while the pieces of data taken in each of the master latches MS of the subordinate flip-flop group FS are held by a data latch portion (see FIG. 4) composed of the clocked inverter IbS and the NAND circuit NAS.

When the slave clock SCLK changes to H level, as shown in FIG. 5, the slave latches S1, S2, ..., Sn, SSn+1, ..., SS2n take in the pieces of data held in the master latches M1, M2, ..., Mn, MSn+1, ..., MS2n. When the slave clock changes to L level, the pieces of data taken in each of the slave latches S of the main flip-flop group FL are held by a data latch portion composed of the clocked inverter ibL and the NAND circuit naL while the pieces of data taken in each of the slave latches SS of the subordinate flip-flop group FS are held by a data latch portion composed of the clocked inverter ibS and the NAND circuit naS.

In the above-described manner, every time each of the master clock MCLK and the slave clock SCLK changes to H level, pieces of data are transferred to and held in flip-flops in next stages. As described above, each flip-flop of the main flip-flop group FL is formed to have relatively large transistor sizes and is superior in soft error tolerance. On the other hand, each flip-flop of the subordinate flip-flop group FS is formed to have relatively small transistor sizes and is inferior in soft error tolerance. Although short-time data retention at the time of serial transfer is possible also in each flip-flop of the subordinate flip-flop group FS, data retention for a relatively long time cannot be guaranteed.

For this reason, the present embodiment is configured such that when pieces of data are transferred to an end, and a serial transfer period ends, pieces of data held in the flip-flops of the subordinate flip-flop group FS are transferred to the flip-flops of the main flip-flop group FL. The master latch M and the slave latch S of each flip-flop hold pieces of identical data, and a latch output may be taken out from one of the master latch M and the slave latch S. In his embodiment, the pieces of data held in the flip-flops of the subordinate flip-flop group FS are transferred to and held in the unused other latches of the main flip-flop group FL.

More specifically, when data serial transfer is ended, the switch signal DTRp changes from L level to H level. This turns off the transfer gates Ta and turns on the transfer gates Tb. Accordingly, pieces of data held in the master latches MSn+1, ..., MS2n of the flip-flops of the subordinate flip-flop group FS are supplied to the DIN terminals of the slave latches S1, ..., Sn of the main flip-flop group FL through the transfer gates Tb1, ..., Tbn.

In this state, the slave clock SCLK is set to H level once, as shown in FIG. 5. The slave latches S1, S2, ..., Sn take in pieces of data held in the master latches MSn+1, MSn+2, ..., MS2n of the subordinate flip-flop group FS. When the slave clock SCLK changes to L level, the pieces of data taken in each of the slave latches S of the main flip-flop group FL are held by the data latch portion composed of the clocked inverter ibL and the NAND circuit naL. In the above-described manner, pieces of data taken in the flip-flops of the subordinate flip-flop group FS are held in the slave latches S of the flip-flops of the main flip-flop group FL.

As described above, since outputs from all the flip-flops after serial transfer are held in the master latches M and slave latches S of the flip-flops of the main flip-flop group FL superior in soft error tolerance, data can be reliably held regardless of effects of cosmic rays and the like. Note that it is necessary to read latch outputs from the output terminal Od and an output terminal od to correspond to an original data sequence at the time of reading.

As described above, in the present embodiment, the main flip-flop group in which each of the master latches and slave latches is formed to have transistor sizes required to achieve sufficient soft error tolerance and the subordinate flip-flop group formed to have minimum transistor sizes are used, and pieces of latch data in the subordinate flip-flop group are transferred to the latches not used for latch output of the main flip-flop group. This ensures sufficient soft error tolerance and makes it possible to reduce a circuit area of an entire shift register. The transmission paths through which the master clock and slave clock are transmitted are formed to be symmetrical to each other in all, including transistor size, and racing does not occur.

Note that an example in which the number of flip-flops of the main flip-flop group FL is equal to the number of flip-flops of the subordinate flip-flop group FS has been described in the present embodiment. However, it suffices that pieces of data in flip-flops of a subordinate flip-flop group can be transferred to flip-flops of a main flip-flop group. Accordingly, a shift register according to the present embodiment can be similarly configured as long as the number of flip-flops of the main flip-flop group FL is not less than the number of flip-flops of the subordinate flip-flop group FS.

Although an example in which pieces of data latched in the flip-flops of the subordinate flip-flop group FS are transferred to the slave latches of the flip-flops of the main flip-flop group FL has been described, it is apparent that a shift register according to the present embodiment may be configured such that the pieces of data are transferred to the master latches.

Second Embodiment

Figure 6:
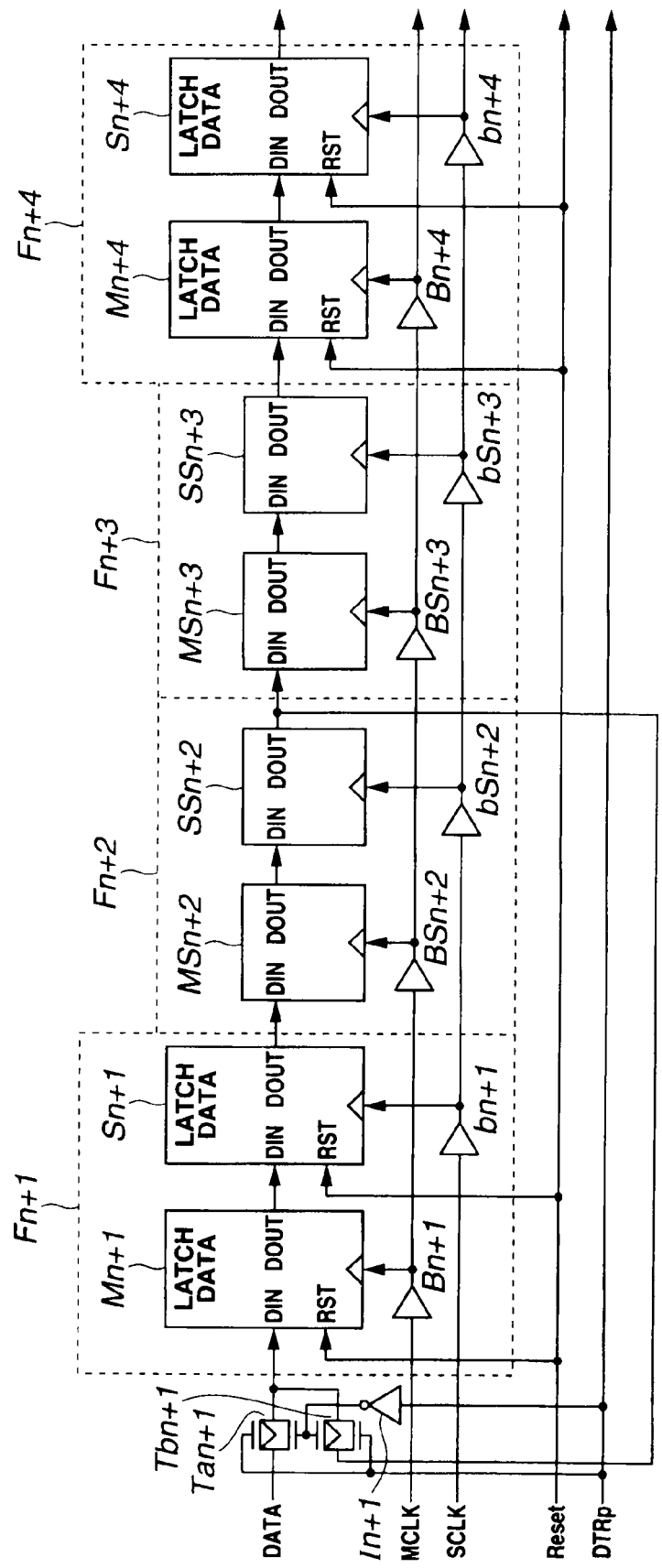
FIG. 6 is a circuit diagram showing a second embodiment of the present invention.

FIG. 6 is a circuit diagram showing a second embodiment of the present invention. Components identical to components in FIG. 1 are denoted by identical reference numerals in FIG. 6, and a description of the components will be omitted.

In the present embodiment, two flip-flops of a subordinate flip-flop group FS and two flip-flops of a main flip-flop group FL are disposed alternately. A shift register according to the present embodiment has a transfer gate Ta and a transfer gate Tb for each set of four flip-flops and is formed by repeatedly arranging a combination of the transfer gates Ta and Tb and four flip-flops. FIG. 6 shows only one combination of the transfer gates Ta and Tb and four flip-flops.

Of the four flip-flops in FIG. 6, first and last flip-flops Fn+1 and Fn+4 are flip-flops of the main flip-flop group FL each of which is composed of transistors, each having a relatively large transistor size and sufficient soft error tolerance, while two central flip-flops Fn+2 and Fn+3 are flip-flops of the subordinate flip-flop group FS, each of which has relatively small transistor sizes and a reduced circuit area.

The flip-flops Fn+1 and Fn+4 have configurations identical to each other and each includes a master latch M and a slave latch S. The master latch M has a configuration identical to, e.g., the configuration of the master latch M in FIG. 4 and is composed of transistors with sufficiently large sizes. The slave latch S has a configuration identical to, e.g., the configuration of the slave latch S in FIG. 4 and is composed of transistors with sufficiently large sizes. For this reason, each of the flip-flops Fn+1 and Fn+4 of the main flip-flop group FL has sufficient soft error tolerance.

The flip-flops Fn+2 and Fn+3 have configurations identical to each other and each includes a master latch MS and a slave latch SS. The master latch MS has a configuration identical to, e.g., the configuration of the master latch MS in FIG. 4 and is composed of transistors with sufficiently small sizes. The slave latch SS has a configuration identical to, e.g., the configuration of the slave latch SS in FIG. 4 and is composed of transistors with sufficiently small sizes. For this reason, each of the flip-flops Fn+2 and Fn+3 of the subordinate flip-flop group FS has a sufficiently small circuit area.

An output from a DOUT terminal of a slave latch Sn+1 of the flip-flop Fn+1 is supplied to a DIN terminal of a master latch MSn+2 of the flip-flop Fn+2. An output from a DOUT terminal of a slave latch SSn+2 of the flip-flop Fn+2 is supplied to a DIN terminal of a master latch MSn+3 of the flip-flop Fn+3. An output from a DOUT terminal of a slave latch SSn+3 of the flip-flop Fn+3 is supplied to a DIN terminal of a master latch Mn+4 of the flip-flop Fn+4.

An output from a DOUT terminal of a slave latch Sn+4 of the last flip-flop Fn+4 is supplied to a DIN terminal of a master latch Mn+5 of a flip-flop Fn+5 in a next stage (not shown) through a transfer gate Tan+5 in the next stage. Data is supplied to a DIN terminal of the master latch Mn+1 of the first flip-flop Fn+1 through a transfer gate Tan+1 or a transfer gate Tbn+1. An output from a DOUT terminal of a slave latch Sn of a flip-flop Fn in a previous stage (not shown) is supplied to the transfer gate Tan+1.

The present embodiment is configured such that the output from the DOUT terminal of the slave latch SSn+2 of the central flip-flop Fn+2 is also supplied to a DIN terminal of the master latch Mn+1 of the first flip-flop Fn+1 through the transfer gate Tbn+1.

A switch signal DTRp is supplied to one ends of transfer gates ..., Tan+1, Tan+5, ... and the other ends of transfer gates ..., Tbn+1, Tbn+5, ..... An inversion signal of the switch signal DTRp is supplied to the other ends of the transfer gates ..., Tan+1, Tan+5, ... and one ends of the transfer gates ..., Tbn+1, Tbn+5, ... through inverters ..., In+1, In+5, ..... This causes the transfer gates Ta to be turned on and the transfer gates Tb to be turned off during an L level period of the switch signal DTRp. The transfer gates Ta are turned off, and the transfer gates Tb are turned on, during an H level period of the switch signal DTRp.

A master clock MCLK is transmitted through serially connected buffers ..., Bn+1, ..., Bn+4, ..., and outputs from the buffers Bn+1 to Bn+4 are supplied to the master latches Mn+1, MSn+2, MSn+3, and Mn+4, respectively. A slave clock SCLK is transmitted through serially connected buffers ..., bn+1, ..., bn+4, ... and outputs from the buffers bn+1 to bn+4 are supplied to the slave latches Sn+1, SSn+2, SSn+3, and Sn+4, respectively.

The buffers Bn+1 and Bn+4 configured to supply the master clock MCLK to the main flip-flop group FL are formed to have relatively large transistor sizes while the buffers BSn+2 and BSn+3 configured to supply the master clock MCLK to the subordinate flip-flop group FS are formed to have relatively small transistor sizes. Similarly, the buffers bn+1 and bn+4 configured to supply the slave clock SCLK to the main flip-flop group FL are formed to have relatively large transistor sizes while the buffers bSn+2 and bSn+3 configured to supply the slave clock SCLK to the subordinate flip-flop group FS are formed to have relatively small transistor sizes.

In other words, in the present embodiment as well, a transmission path for the master clock MCLK and a transmission path for the slave clock SCLK are formed to be symmetrical to each other in all, including transistor size. Accordingly, there is no racing between the master clock MCLK and the slave clock SCLK. Since the clocks are transmitted through the buffers provided in the flip-flops Fn+1, Fn+2, ... in the transmission path for the master clock MCLK and the transmission path for the slave clock SCLK, no racing occurs also between each clock and data.

Figure 7:
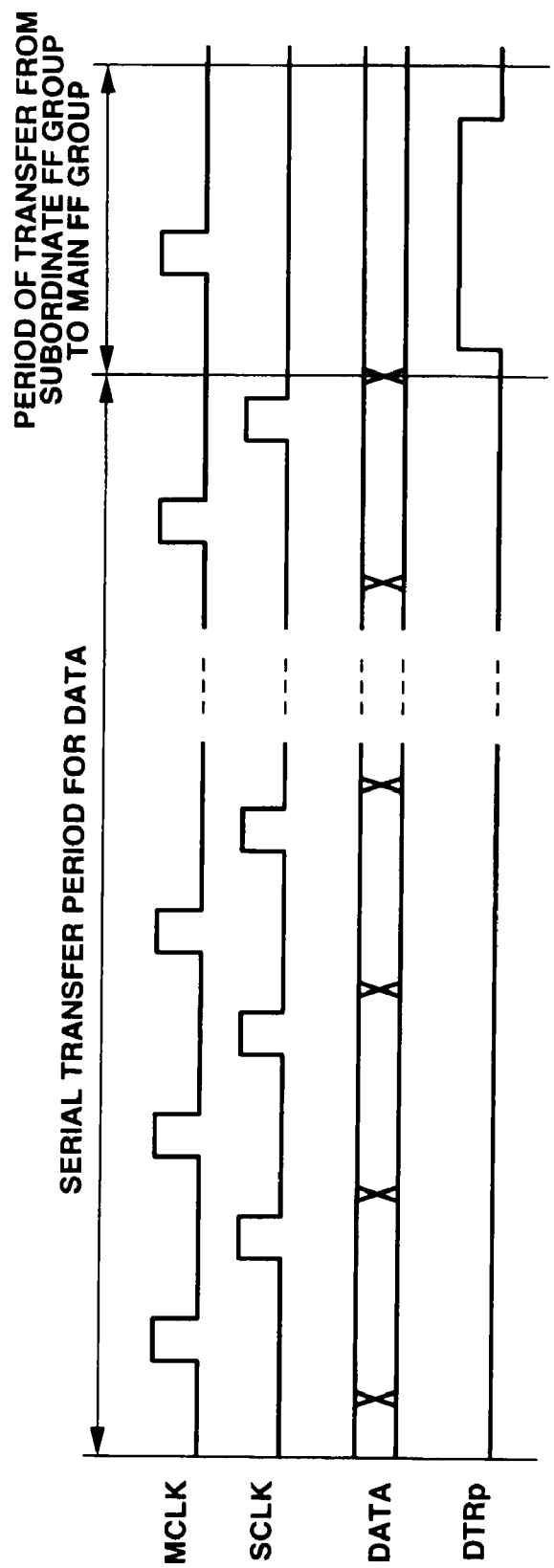
FIG. 7 is a timing chart for explaining operation in the second embodiment.

Operation of the embodiment with the above-described configuration will be described with reference to FIG. 7. FIG. 7 is a timing chart for explaining the operation in the second embodiment and shows the master clock MCLK, the slave clock SCLK, data, and the switch signal DTRp.

As shown in FIG. 7, the switch signal DTRp is at L level during a serial transfer period for data. Accordingly, the transfer gates Ta are on, and the transfer gates Tb are off, during the serial transfer period. Pieces of data in DOUT terminals of slave latches ..., Sn, Sn+4, ... in previous stages are thus provided to the master latches ..., Mn+1, Mn+5, ... of the flip-flops ..., Fn+1, Fn+5, ....

When the master clock MCLK changes to H level, the master latch Mn+1 takes in a piece of data outputted from the slave latch Sn in the previous stage while the master latches MSn+2, MSn+3, and Mn+4 take in pieces of data in the slave latches Sn+1, SSn+2, and SSn+3 in the previous stage. When the master clock MCLK changes to L level, the pieces of data taken in each of the master latches Mn+1 and Mn+4 are held by a data latch portion (see FIG. 4) composed of a clocked inverter IbL and a NAND circuit NAL while the pieces of data taken in each of the master latches MSn+2 and MSn+3 are held by a data latch portion (see FIG. 4) composed of a clocked inverter IbS and a NAND circuit NAS.

When the slave clock SCLK changes to H level, as shown in FIG. 7, the slave latches Sn+1, SSn+2, SSn+3, and Sn+4 take in the pieces of data held in the master latches Mn+1, MSn+2, MSn+3, and Mn+4. When the slave clock SCLK changes to L level, the pieces of data taken in each of the slave latches Sn+1 and Sn+4 are held by a data latch portion composed of a clocked inverter ibL and a NAND circuit naL while the pieces of data taken in each of the slave latches SSn+2 and SSn+3 are held by a data latch portion composed of a clocked inverter ibS and a NAND circuit naS.

In the above-described manner, every time each of the master clock MCLK and the slave clock SCLK changes to H level, pieces of data are transferred to and held in flip-flops in next stages. As described above, each flip-flop of the main flip-flop group FL is formed to have relatively large transistor sizes and is superior in soft error tolerance. On the other hand, each flip-flop of the subordinate flip-flop group FS is formed to have relatively small transistor sizes and is inferior in soft error tolerance.

For this reason, the present embodiment is also configured such that when pieces of data are transferred to an end, and a serial transfer period ends, pieces of data held in the flip-flops of the subordinate flip-flop group FS are transferred to the flip-flops of the main flip-flop group FL.

More specifically, when data serial transfer is ended, the switch signal DTRp changes from L level to H level. This turns off the transfer gates Ta and turns on the transfer gates Tb. Accordingly, a piece of data held in the slave latch SSn+2 of the flip-flop Fn+2 of the subordinate flip-flop group FS is supplied to the DIN terminal of the master latch Mn+1 of the flip-flop Fn+1 through the transfer gate Tbn+1.

In this state, the master clock MCLK is set to H level once, as shown in FIG. 7. The master latches Mn+1 and Mn+4 take in pieces of data held in the slave latches SSn+2 and SSn+3 of the subordinate flip-flop group FS. When the master clock MCLK changes to L level, the pieces of data taken in each of the master latches Mn+1 and Mn+4 of the main flip-flop group FL are held by the data latch portion composed of the clocked inverter IbL and the NAND circuit NAL. In the above-described manner, pieces of data taken in the flip-flops of the subordinate flip-flop group FS are held in the master latches M of the flip-flops of the main flip-flop group FL.

As described above, since outputs from all the flip-flops after serial transfer are held in the flip-flops of the main flip-flop group FL superior in soft error tolerance, data can be reliably held regardless of effects of cosmic rays and the like. Note that it is necessary to read latch outputs from output terminals Od and od (see FIG. 4) to correspond to an original data sequence at the time of reading.

As described above, the present embodiment can achieve same advantages as advantages of the first embodiment.

Having described the preferred embodiments of the invention referring to the accompanying drawings, it should be understood that the present invention is not limited to those precise embodiments and various changes and modifications thereof could be made by one skilled in the art without departing from the spirit of the invention as defined in the appended claims.

What is claimed is:

1. A shift register comprising:
   a plurality of first flip-flops, each having a master latch and a slave latch, each of which includes a transistor with a first transistor size;
   a plurality of second flip-flops, each having a master latch and a slave latch, each of which includes a transistor with a transistor size smaller than the first transistor size; and
   a transfer portion configured to serially transfer data through the plurality of cascaded first and second flip-flops and, when the serial transfer is ended, provide pieces of data held in the second flip-flops to one of the master latches and the slave latches of the first flip-flops to cause the one latch to store the pieces of data.

2. The shift register according to claim 1, wherein the first and second flip-flops have a first transmission path through which a master clock to be supplied to the master latches is transmitted and a second transmission path through which a slave lock to be supplied to the slave latches is transmitted.

3. The shift register according to claim 2, wherein the first and second transmission paths are formed to be symmetrical to each other.

* * * * *